US006245612B1

(12) United States Patent
Chang et al.

(10) Patent No.: US 6,245,612 B1
(45) Date of Patent: Jun. 12, 2001

(54) METHOD FOR MAKING THE BOTTOM ELECTRODE OF A CAPACITOR

(75) Inventors: Wen-Pin Chang, Ilan; Ming-Lun Chang, Hsinchu, both of (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/533,004

(22) Filed: Mar. 22, 2000

(30) Foreign Application Priority Data

Nov. 29, 1999 (TW) .................................................. 88120765

(51) Int. Cl.[7] ...................... H01L 21/8242; H01L 21/20
(52) U.S. Cl. ....................... 438/249; 438/243; 438/244; 438/245; 438/246; 438/247; 438/248; 438/386; 438/387; 438/388; 438/389; 438/390; 438/391; 438/392
(58) Field of Search ................................. 438/243–249, 438/386–392

(56) References Cited

U.S. PATENT DOCUMENTS

| 5,618,751 | * | 4/1997 | Golden et al. ...................... 438/392 |
| 5,981,332 | * | 11/1999 | Mandelman et al. ................ 438/246 |
| 6,057,216 | * | 5/2000 | Economikos et al. .............. 438/559 |
| 6,090,661 | * | 7/2000 | Perng et al. ......................... 438/248 |

* cited by examiner

Primary Examiner—John F. Niebling
Assistant Examiner—Jennifer M. Kennedy
(74) Attorney, Agent, or Firm—Ladas & Parry (57) ABSTRACT

The present invention provides a method for making the bottom electrode of a buried capacitor, which is characterized by protecting the non-bottom electrode region with a LPD oxide layer to prevent the impurities within the doped Si glass remaining in non-bottom electrode region from driving into the substrate during annealing, thus non-desired diffusing region connecting to the bottom electrode will be generated. Consequently, the leakage current existing in conventional buried capacitor will be effectively reduced according to the method of this present invention.

24 Claims, 6 Drawing Sheets

METHOD FOR MAKING THE BOTTOM ELECTRODE OF A CAPACITOR

BACKGROUND OF THE INVENTION

1. Field of the Invention

The present invention relates to a method for making buried bottom electrodes, and particularly relates to a method for making the bottom electrode of a buried capacitor, which can improve the vertical leakage current.

2. Description of the Prior Art

Deep trench has been widely used in advanced DRAM technology, wherein the capacitors are buried in the trench. The electronic property of the DRAM is based on the charge-storing capacity, which is determined by the area of the electrodes of the capacitor. Recently, the effective region for bottom electrodes of the buried capacitors can be defined by photolithography and etching processes. The processes for fabricating the traditional buried capacitor are illustrated in FIG. 1A to FIG. 1E.

Figure 1A:
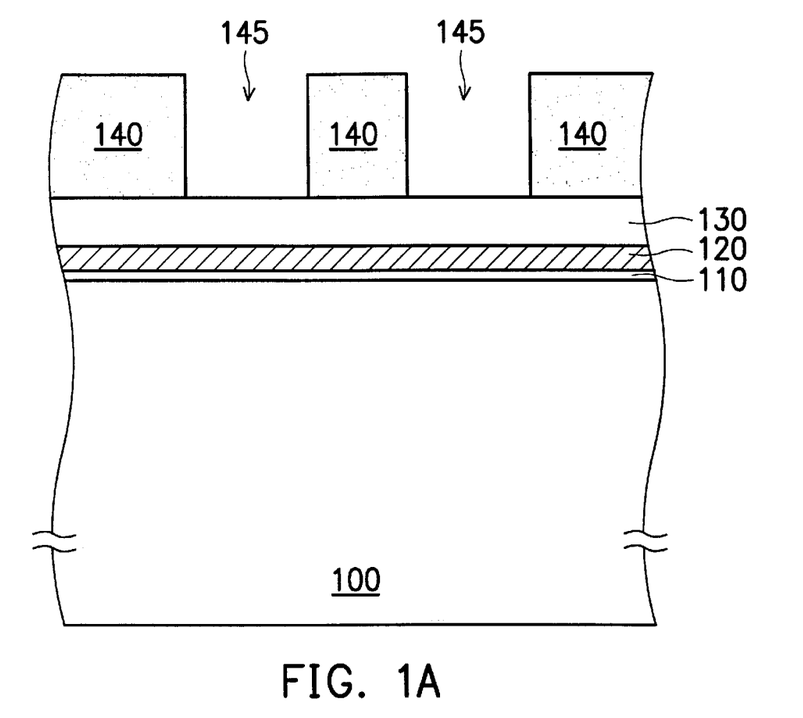
FIG. 1A~1E are cross-sectional views of processes for making the bottom electrode of a conventional buried capacitor.

Referring to FIG. 1A, a P-type Si substrate is provided. A pad oxide layer 110 with a thickness of about 45 Å is formed on the substrate 100 by way of thermal oxidation. A silicon nitride layer 120 and a TEOS layer 130 are deposited on the pad oxide layer 110 in series. Then, a photoresist pattern 140 with an opening for etching is formed on the TEOS layer 130 by photolithography and etching processes.

Figure 1B:
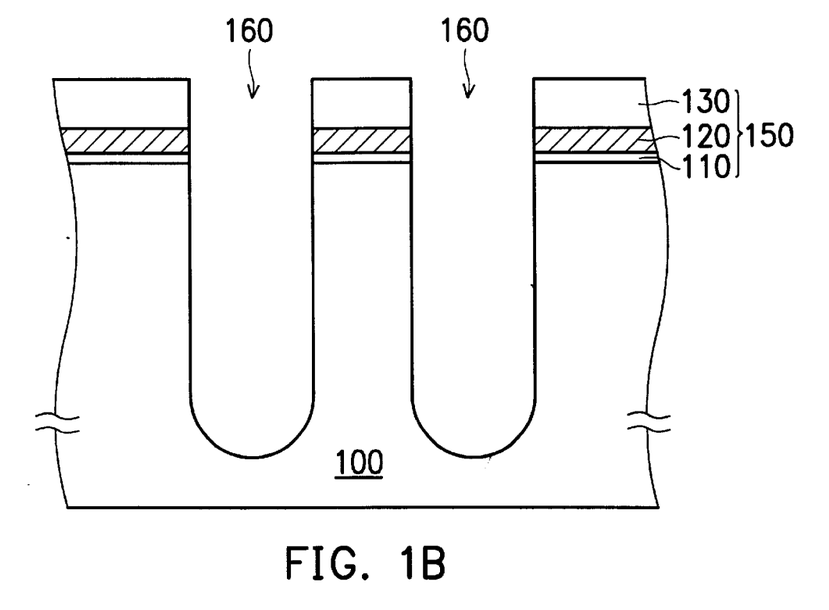

Referring to FIG. 1B, by using the photoresist pattern 140 as an etching mask, the exposed TEOS layer 130 within the opening, and the silicon nitride layer 120, the pad oxide layer 110 underlying the exposed TEOS layer 130 are removed by dry-etching to pattern a hard mask 150. Then, the photoresist pattern 140 is removed. The substrate 100 unshielded by the hard mask 150 is etched to form a trench 160 with a depth ranging from 7 μpm to 8 μm.

Figure 1C:
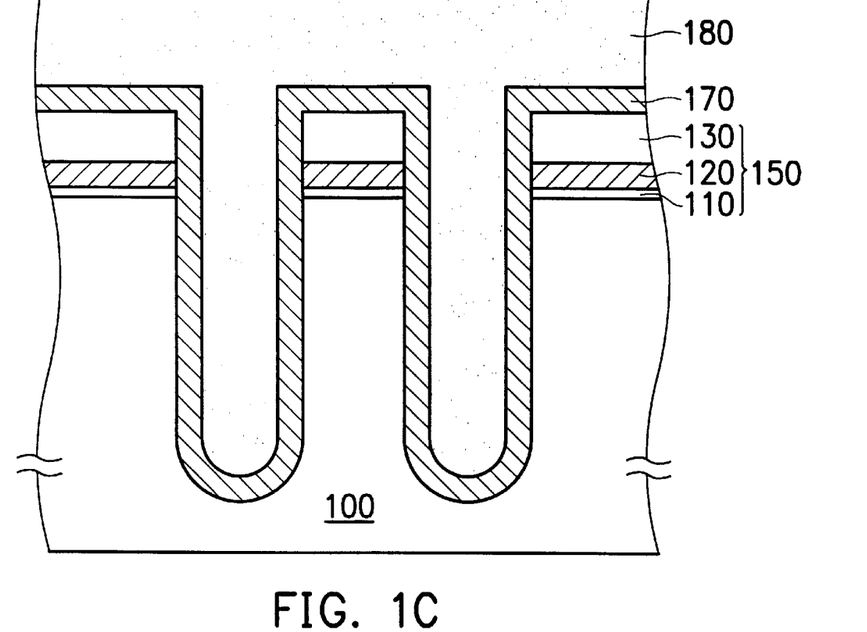

Referring to FIG. 1C, a N-type Si-glass, such as AsSG, is deposited to comfortably cover the TEOS layer 130 and the side wall of the trench 160. Then, a photoresist layer 180 is formed on the Si substrate 170, and filled the trench 160.

Figure 1D:
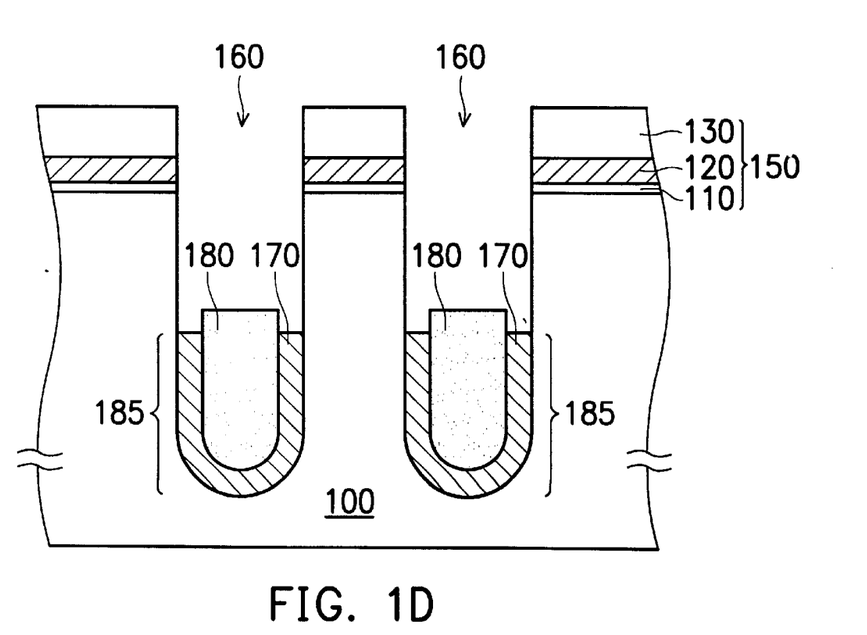

Referring to FIG. 1D, a photoresist 180 with a thickness of about 4~6 μm and the remained N-type Si glass 170 are left on the bottom of the trench 160 to define the predetermined region 185 for the bottom electrode by etching back the photoresist 180 and the N-type Si glass 170.

Figure 1E:
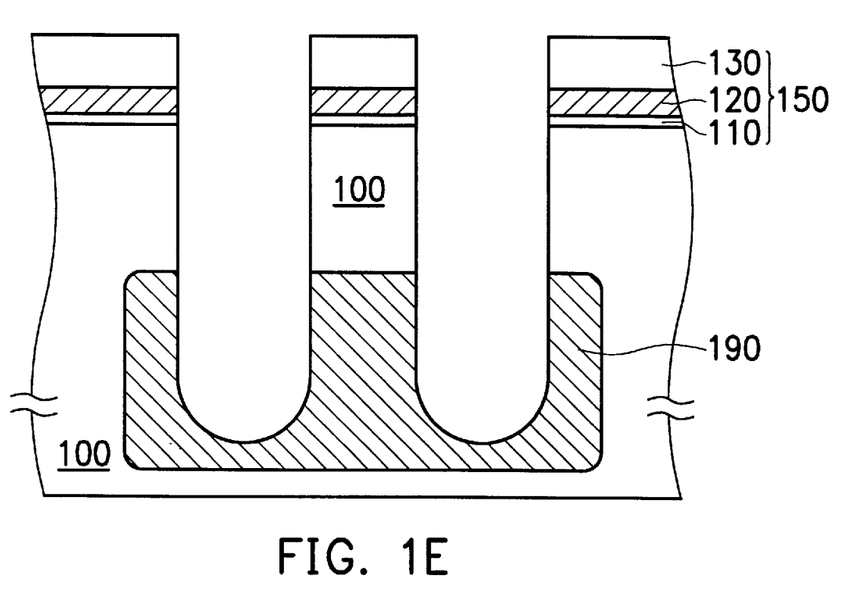

Referring to FIG. 1E, a TEOS layer with a thickness ranging from 100 Å~300 Å (unshown) is deposited after removing the photoresist layer 180. Then, an annealing treatment is applied to drive the N-type impurities within the Si-glass 170 to diffuse into the bottom electrode region 185 through the side wall of the trench 160, thus a bottom electrode 190 consisting of N-type diffusion region is generated.

However, when wet etching is used to define the predetermined region 185 for the bottom electrode 190, some remains of the N-type Si-glass 170 will be left beside the predetermined region 185 for the bottom electrode, and particularly the side wall of the trench upside the predetermined region 185 for the bottom electrode 190. The N-type impurities within the remains left beside the predetermined region 185 for the bottom electrode 190 will be driven to diffuse into the P-type substrate 100 during annealing, thus a non-desired N-type diffusion region connecting to the bottom electrode 190 is generated. Accordingly, a serious leakage current will appear in the buried capacitor comprising the bottom electrode made according to the above-mentioned method.

SUMMARY OF THE INVENTION

The object of the present invention is to reduce the above-mentioned leakage current and to provide a method for making the bottom electrode of a buried capacitor. This present method is characterized by protecting the non-bottom electrode region with a LPD oxide layer to prevent the impurities within the doped Si-glass remained in non-bottom electrode region from driving into the substrate during annealing. Thus non-desired diffusing region connecting to the bottom electrode will be generated. Consequently, the leakage current existing in conventional buried capacitor will be effectively reduced according to the method disclosed in this present invention.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

A method for making the bottom electrode of a buried capacitor is provided, which begins with providing a first type Si-substrate. Then, a trench in the first type Si-substrate for forming the buried capacitor therein is difined. A first oxide layer, such as $SiO_2$ layer, is formed to comfortably cover the side wall of the trench. A photoresist with a desired thickness is filled on bottom of the trench by photolithography and etching back. Then, a second oxide layer, such as a $SiO_2$ layer with a thickness ranging from 100 Å~300 Å, is formed by way of liquid phase deposition (LPD) to comfortably cover the first oxide layer. The LPD $SiO_2$ can be generated by the reaction of $H_2SiF_6$ and $H_2O$ ($H_2SiF_6 + 2H_2O \rightarrow 6HF + SiO_2$). Removing the photoresist on the bottom of the trench, the first oxide layer unshielded by the second oxide layer is removed to expose the side wall of the trench. Subsequently, a second type Si-glass is deposited to comformably cover the second oxide layer and the exposed side wall of the trench. Then, a passivation layer, such as a TEOS layer with a thickness of 100 Å, is deposited on the second type Si-glass. Afterwards, an annealing is applied to drive the impurities within the second type Si-glass to diffuse into the first type substrate through the exposed side wall passivated by the passivation layer. Thus a bottom electrode consisting of the second type diffusion region is generated.

As described above, when the first type is P-type, the second type is N-type, and the second type Si-glass consists of either AsSG or PSG. Alternatively, when the first type is N-type, the second type is P-type, and the second type Si-glass consists of BSG.

According to the above-mentioned method, the non-bottom electrode region is protected by a LPD oxide layer, therefore the impurities within the second type Si-glass remained in non-bottom electrode region are prevented from driving into the first type substrate during anneal. Thus non-desired diffusing region connecting to the bottom electrode will be generated. Consequently, the leakage current existing in conventional buried capacitor will be effectively reduced according to the method disclosed in this present invention.

Also, another method for making the bottom electrode of a buried capacitor is provided, which begins with providing a first type Si-substrate. Then, a hard mask with an opening exposing the substrate is formed on the first-type substrate. By using the hard mask as an etching mask, the exposed substrate in the opening is removed, and a trench for forming a buried capacitor therein is produced. A first oxide layer, such as a $SiO_2$ layer with a thickness of 10 Å, is formed by thermal oxidation or $O_3$-oxidation to comfortably cover the hard mask and the side wall of the trench. A first photoresist is formed on the first oxide layer and filled the trench by photolithography, then a second photoresist with a desired depth is left on the bottom of the trench by etching the first photoresist on the first oxide layer and the top portion within the trench. Subsequently, a second oxide layer, such as a $SiO_2$ layer with a thickness ranging from 100 Å~300 Å, is formed by way of liquid phase deposition (LPD) to conformally cover the hard mask and the first oxide layer. The LPD $SiO_2$ can be generated by the reaction of $H_2SiF_6$ and $H_2O$ ($H_2SiF_6 + 2H_2O \rightarrow 6HF + SiO_2$). Removing the second photoresist on the bottom of the trench, the first oxide layer unshielded by the second oxide layer is removed by wet dipping to expose the side wall of the trench. A second type Si-glass is deposited to conformally cover the second oxide layer and the exposed side wall of the trench. Then, a passivation layer, such as a TEOS layer with a thickness of 100 Å, is deposited on the second-type Si-glass. Afterwards, an annealing is applied at 1050° C. for 20 minutes to drive the impurities within the second type Si-glass to diffuse into the first type Si-substrate through the exposed side wall passivated by the passivation layer. Thus, a diffusion region consisting of the second type impurities is generated and used as the bottom electrode of a buried capacitor. Finally, the passivation layer, the Si-glass layer, the second oxide layer and the first oxide layer are removed by wet etching using either HF, DHF, or BHF solution as the etchant.

As described above, when the first type is P-type, the second type is N-type, and the Si-glass doped with the second type impurities consists of either AsSG or PSG. Alternatively, when the first type is N-type, the second type is P-type, and the Si-glass doped with the second type impurities consists of BSG.

EMBODIMENT OF THE INVENTION

Figure 2A:
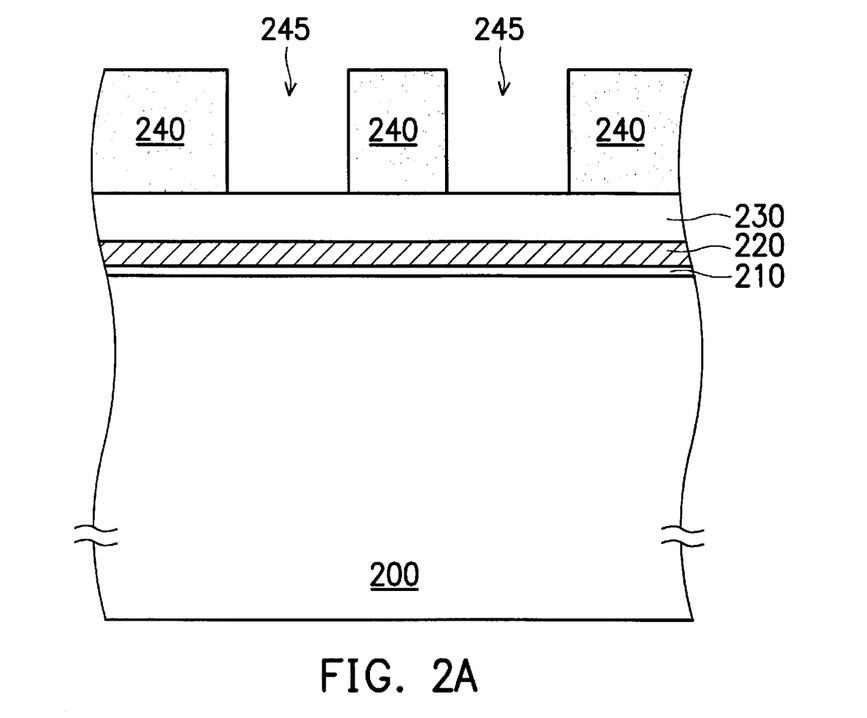
FIG. 2A~2F are cross-sectional views of a method for making the bottom electrode of a buried capacitor according to an embodiment of this invention.

First, referring to FIG. 2A, a P-type Si-substrate 200 was provided. A pad oxide layer 210 with a thickness of about 45 Å was formed on the substrate 200. The pad oxide layer 210 can be formed by either thermal oxidation or CVD. Then, a silicon nitride layer 220 and a TEOS layer 230 were deposited on the pad oxide layer 210 in series by CVD. Afterwards, a photoresist pattern 240 with an opening 245 for etching was formed on the TEOS layer 230.

Figure 2B:
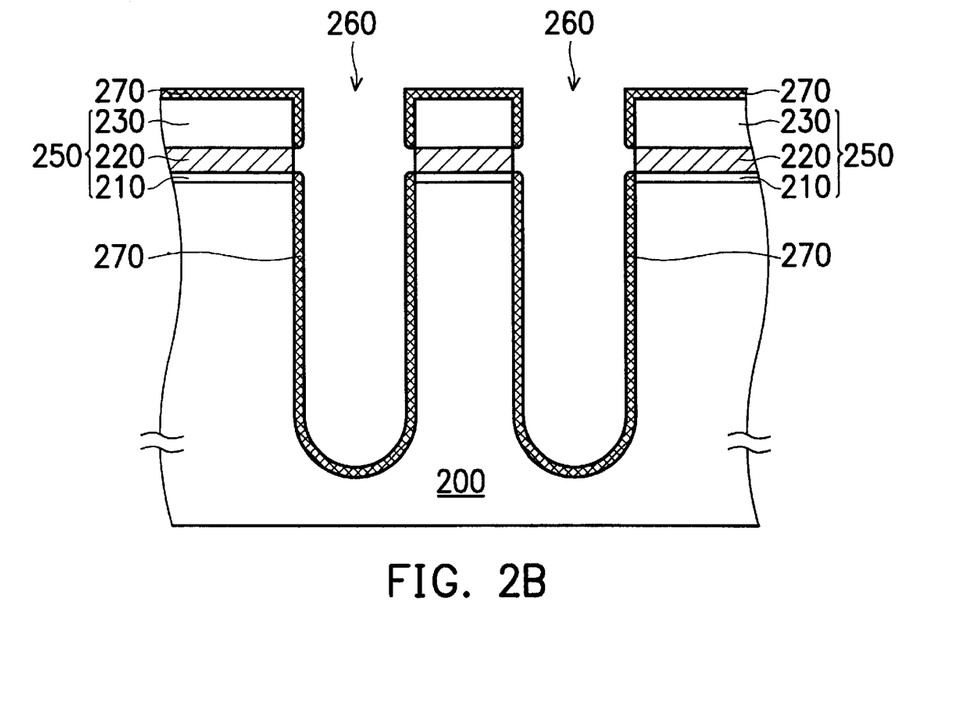

Next, referring to FIG. 2B, by using the photoresist pattern 240 as a mask, the exposed TEOS layer 230 in the opening 245 and the silicon nitride layer 220 and pad oxide layer 210 were etched to form a hard mask 250. Then the photoresist pattern 240 was removed. A trench with a depth of about 7~8 μm was formed by etching the substrate 200 unshielded by the hard mask 250. A thin oxide layer 270 with a thickness of about 10 Å was formed on the TEOS 230 and the inner side-walls of the trench 260 by dry oxidation, such as thermal oxidation or $O_3$-oxidation.

Figure 2C:
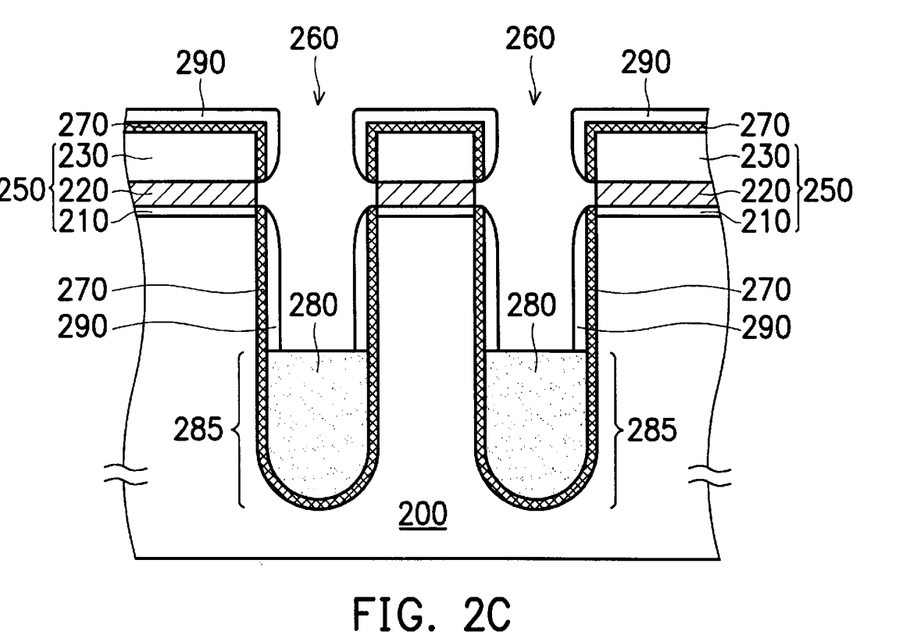

Next, referring to FIG. 2C, a photoresist layer 280 was formed on the thin oxide layer 270 and filled the trench 260 by photolithography. Then, the photoresist layer 280 on the hard mask 250 and partial of the photoresist layer 280 were removed by etching back, and a photoresist 280 with a thickness of about 4~6 μm was remained on the bottom of the trench 260 to define the predetermined region 285 for bottom electrodes of the buried capacitor.

Afterwards, a LPO (liquid phase oxide) layer 290 with a thickness of about 300 Å was deposited on the thin oxide layer 270 by liquid phase deposition (LPD). Owing to the fact that the LPO layer can only deposit on the oxide layer, therefore the LPO layer 290 mentioned above did not deposit on the silicon nitride 220 and the photoresist layer 280.

Figure 2D:
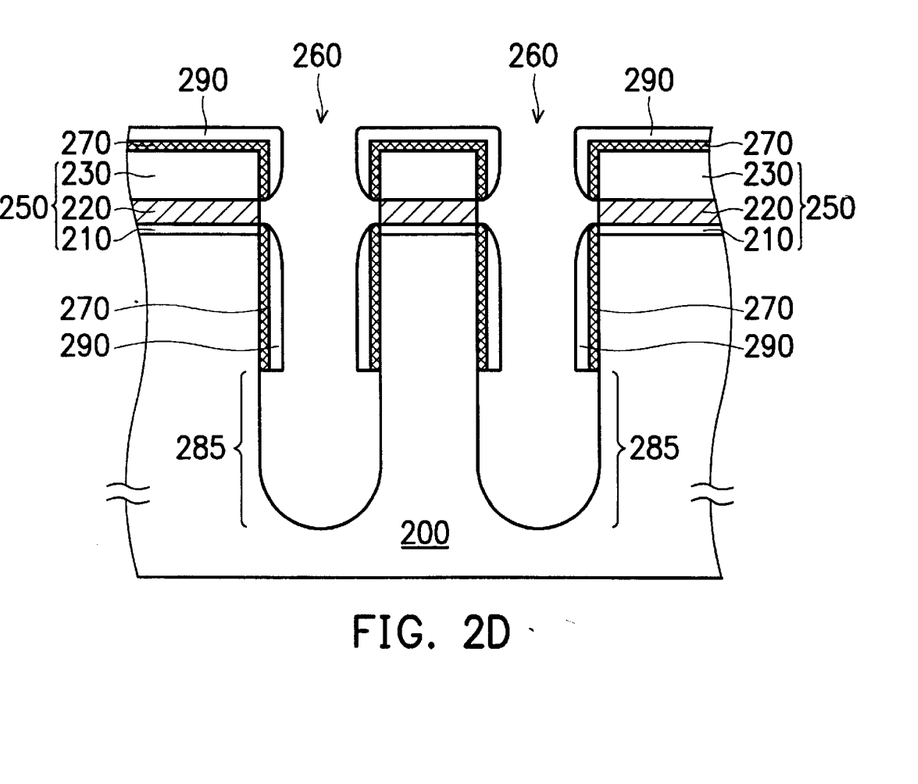

Next, referring to FIG. 2D, the photoresist 280 within the bottom of the trench 260 was removed by either dry etching or wet etching. Then, the thin oxide layer 270 located in the predetermined region 285 for bottom electrodes and unshieled by the LPO layer 290 was removed to expose the substrate 200.

Figure 2E:
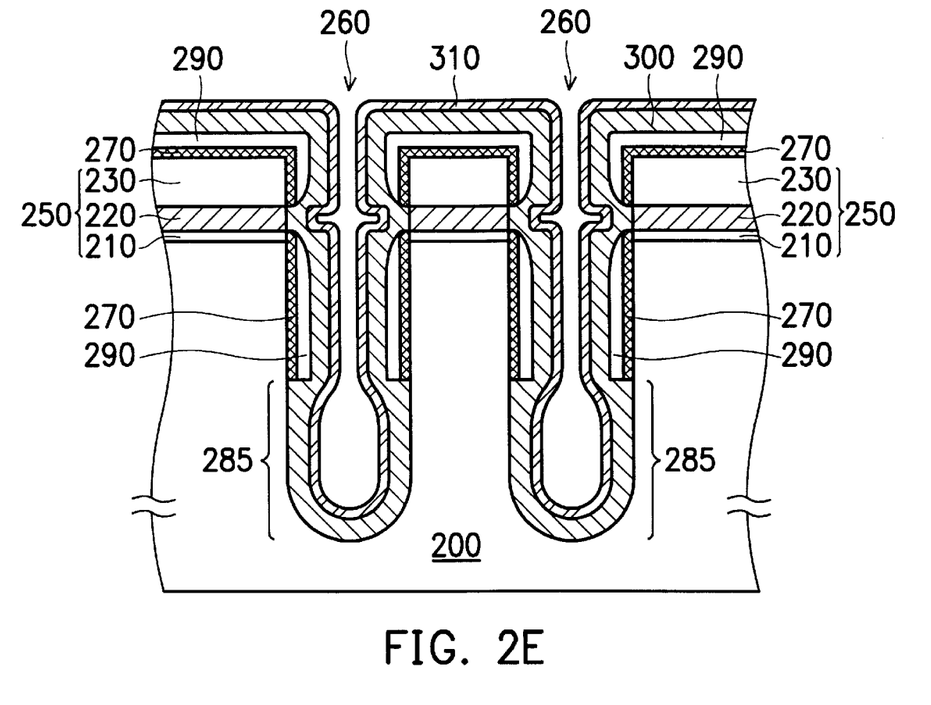

Next, referring to FIG. 2E, a CVD AsSG layer 300 was formed on the LPO layer 290 and the side wall of the trench 260 surrounded by the predetermined region 285 of the bottom electrode 285. Then a TEOS layer 310 was formed on the AsSG layer 300.

Figure 2F:
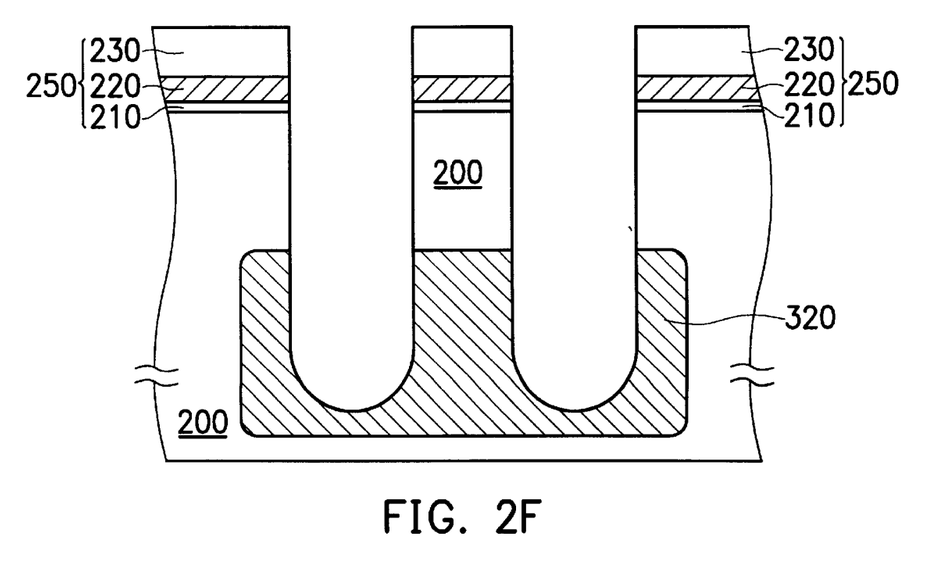

Referring to FIG. 2F, an annealing was applied at 1050° C. for 20 minutes to drive the As ions within the AsSG 300 to diffuse into the predetermined region 285 of the bottom electrode through the side wall of the trench 260. Subsequently, a bottom electrode 320 consists of As diffusion region was generated. Then, the TEOS layer 310, the AsSG layer 300, the LPO layer 290 and the thin oxide layer 270 were removed by wet etching using either HF, DHF or BHF solution.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for making the bottom electrode of a buried capacitor, comprising the following steps:

providing a first type Si-substrate with a patterned trench;

forming a first oxide layer to conformally overlay the side wall of the trench;

filling a photoresist into the trench by means of photolithography and etching-back;

forming a second oxide layer to conformally overlay the first oxide layer by means of liquid phase deposition (LPD);

removing the photoresist on the bottom of the trench;

removing the first oxide layer uncovered by the second oxide layer to expose the side wall of the trench;

forming a second type Si-glass layer to conformally overlay the second oxide layer and the side wall of the trench;

forming a passivation layer on the second type Si-glass layer;

annealing to drive the impurities within the second type Si-glass layer to diffuse into the Si-substrate and form a second type diffusion region as the bottom electrode of a buried capacitor; and removing the passivation layer, the Si-glass layer, the second oxide layer and the first oxide layer in series.

2. The method as claimed in claim 1, wherein the first oxide layer consists of silicon oxide with a thickness ranging from 5 Å to 100 Å.

3. The method as claimed in claim 2, wherein the first oxide layer is formed by dry oxidation.

4. The method as claimed in claim 1, wherein the thickness of the second oxide layer ranges from 100 Å to 300 Å.

5. The method as claimed in claim 1, wherein the first oxide layer uncovered by the second oxide layer is removed by wet dipping.

6. The method as claimed in claim 1, wherein the passivation layer consists of TEOS with a thickness ranging from 100 Å to 300 Å.

7. The method as claimed in claim 1, wherein the first type is P-type, and the second type is N-type.

8. The method as claimed in claim 7, wherein the second type Si-glass layer consists of AsSG or PSG.

9. The method as claimed in claim 1, wherein the first type is N-type, and the second type is P-type.

10. The method as claimed in claim 9, wherein the second type Si-glass layer consists of BSC.

11. The method as claimed in claim 1, wherein the annealing is applied at a temperature ranging from 900~1200° C. under $N_2$ for 10~50 minutes.

12. The method as claimed in claim 1, wherein the passivation layer, the Si-glass layer, the second oxide layer and the first oxide layer are removed by wet etching.

13. A method for making the bottom electrode of a buried capacitor, comprising the following steps:

providing a first type Si-substrate;

forming a hard mask on the first type Si-substrate, wherein the hard mask has an opening exposing the Si-substrate;

etching the first type Si-substrate within the opening by using the hard mask as an etching mask, and forming a trench in the first type Si-substrate;

forming a first oxide layer to conformally overlay the hard mask and the side wall of the trench;

forming a first photoresist on the first oxide layer and filling the trench by means of photolithography;

removing the first photoresist on the hard mask and the top portion within the trench to form a second photoresist on the bottom of the trench;

forming a second oxide layer to conformally overlay the hardmask and the first oxide layer in the trench by means of liquid phase deposition (LPD);

removing the second photoresist on the bottom of the trench;

removing the first oxide layer uncovered by the second oxide layer to expose the side wall of the trench;

forming a second type Si-glass layer to conformally overlay the second oxide layer and the side wall of the trench;

forming a passivation layer on the second type Si-glass layer;

annealing to drive the impurities within the second type Si-glass layer to diffuse into the first type Si-substrate and form a second type diffusion region as the bottom electrode of a buried capacitor; and removing the passivation layer, the Si-glass layer, the second oxide layer and the first layer in series.

14. The method as claimed in claim 13, wherein the first oxide layer consists of silicon oxide with a thickness ranging from 5 Å to 100 Å.

15. The method as claimed in claim 14, wherein the first oxide layer is formed by dry oxidation.

16. The method as claimed in claim 13, wherein the thickness of the second oxide layer ranges from 100 Å to 300 Å.

17. The method as claimed in claim 13, wherein the first oxide layer uncovered by the second oxide layer is removed by wet dipping.

18. The method as claimed in claim 13, wherein the passivation layer consists of TEOS, and has a thickness ranging from 100 Å to 300 Å.

19. The method as claimed in claim 13, wherein the first type is P-type, and the second type is N-type.

20. The method as claimed in claim 19, wherein the second type Si-glass layer consists of AsSG or PSG.

21. The method as claimed in claim 13, wherin the first type is N-type, and the second type is P-type.

22. The method as claimed in claim 21, wherein the second type Si-glass layer consists of BSG.

23. The method as claimed in claim 13, wherein the annealing is applied at a temperature ranging from 900~1200° C. under $N_2$ for 10 minutes to 50 minutes.

24. The method as claimed in claim 13, wherein the passivation layer, the Si-glass layer, the second oxide layer and the first oxide layer are removed by wet etching.

* * * * *

UNITED STATES PATENT AND TRADEMARK OFFICE
CERTIFICATE OF CORRECTION

PATENT NO.    : 6,245,612 B1
DATED         : June 12, 2001
INVENTOR(S)   : Wen-Pin Chang et al.

It is certified that error appears in the above-identified patent and that said Letters Patent is hereby corrected as shown below:

Title page,
Item [57], please replace the original ABSTRACT with the following replacement ABSTRACT:
-- The present invention provides a method for making the bottom electrode of a buried capacitor, which is characterized by protecting a non-bottom electrode region with a LPD oxide layer to prevent the impurities within doped Si glass remaining in non-bottom electrode region from driving into the substrate during annealing, whereby the thus non-desired diffusing region connecting to the bottom electrode will not be generated. Consequently, the leakage current existing in conventional buried capacitor will be effectively reduced according to the method of this present invention. --

Column 1,
Line 12, change "Deep trench has" to -- Deep trench techniques have --
Line 13, change "wherein the capacitors" to -- wherein capacitors --
Line 14, change "of the DRAM is based on the" to -- of a DRAM cell to store data is based upon its --
Line 16, change "of the capacitor." to -- of the capacitor formed in the DRAM cell. --
Line 17, change "of the buried capacitors can be defined" to -- of buried capacitors have been defined --
Lines 18-19, change "The processes for fabricating the traditional" to -- Processes for fabricating a traditional --
Line 20, change "in Fig. 1A to Fig. 1E." to -- by Fig. 1A to Fig. 1E. --
Line 21, change "substrate is provided." to -- substrate 100 is provided. --
Line 23, change "substrate 100 by way of thermal" to -- substrate 100 by thermal --
Line 25, change "Then, a photoresist pattern 140" to -- Then, a layer of photoresist 140 is patterned --
Line 26, change "etching is formed on the" to -- etching on the --
Lines 28-29, change "using the photoresist pattern 140 as an etching mask," to -- using the patterned layer of photoresist 140 as an etch mask, --
Lines 29-30, change "the exposed TEOS layer 130 within the opening, and the silicon nitride layer 120," to -- the exposed portions of the TEOS layer 130, and the silicon nitride layer 120 and --
Line 31, change "the exposed TEOS layer" to -- the exposed portions of the TEOS layer --
Line 33, change "the photoresist pattern 140 is removed." to -- the patterned layer of photoresist is removed. --
Lines 33-34, change "The substrate 100 unshielded by the hard mask 150 is etched to form a trench" to -- Those portions of substrate 100 which are not shielded by the hard mask 150 are etched to form trenches --

UNITED STATES PATENT AND TRADEMARK OFFICE
CERTIFICATE OF CORRECTION

PATENT NO.    : 6,245,612 B1
DATED         : June 12, 2001
INVENTOR(S)   : Wen-Pin Chang et al.

It is certified that error appears in the above-identified patent and that said Letters Patent is hereby corrected as shown below:

Column 1 (cont'd),
Line 36, change "Si-glass," to -- Si-glass 170, --
Line 37, change "deposited to comfortably cover the TEOS layer" to -- deposited to cover conformally the TEOS layer --
Line 38, change "side wall of the trench 160." to -- side walls of the trenches 160. --
Line 41, change "a photoresist 180 with a thickness" to -- the photoresist 180 are etched to a thickness --
Line 42, change "about 4-6 μM and the remained N-type Si glass 70 are" to -- about 4 to 6 μM and the N-type Si glass 70 is also etched. The remaining portions of the photoresist 180 and N-type Si glass are --
Line 43, change "the bottom of the trench 160 to define the" to -- the bottoms of the trenches 160 to define a --
Lines 44-45, change "bottom electrode by etching back the photoresist 180 and the N-type Si glass 170." to -- bottom electrode. --
Line 47, change "from 100Å~300Å (unshown) is" to -- from 100Å to 300Å (not shown) is --
Line 49, change "to drive the" to -- to diffuse the --
Lines 49-50, change "within the Si-glass 170 to diffuse into" to -- in the Si-glass 170 into --
Line 51, change "side wall of the trench 160, thus a" to -- side walls of the trenches 160, thereby forming a --
Lines 52-53, change "region is generated." to -- region. --
Lines 55-56, change "some remains of the N-type Si-glass 170 will be left beside" to -- some of the N-type Si-glass 170 will remain beside --
Lines 57-58, change "region 185 for the bottom electrode, and particularly the side wall of the trench upside the" to -- region 185 on the side walls of the trenches above the --
Line 59, change "region 185 for the bottom electrode 190." to -- region 185. --
Lines 60-61, change "impurities within the remains left beside the predetermined region 185 for the bottom electrode 190 will be driven to" to -- impurities remaining on the side walls above predetermined region 185 be --
Lines 61-62, change "be driven to diffuse into the P-type substrate 100 during annealing," to -- be diffused into the P-type substrate 100 during the aforementioned annealing treatment, --
Lines 62-63, change "thus a non-desired N-type" to -- and as a result an undesirable N-type --
Lines 65-66, change "capacitor comprising the bottom" to -- capacitor having its bottom --

Page 2 of 8

UNITED STATES PATENT AND TRADEMARK OFFICE
CERTIFICATE OF CORRECTION

PATENT NO.     : 6,245,612 B1
DATED           : June 12, 2001
INVENTOR(S)  : Wen-Pin Chang et al.

It is certified that error appears in the above-identified patent and that said Letters Patent is hereby corrected as shown below:

Column 2,
Lines 8-9, change "Si-glass remained in non-bottom electrode region from" to -- Si-glass remaining on the side walls above the predetermined electrode region 185 from --
Line 10, change "during annealing. Thus non-desired diffusing" to -- during annealing treatment. Thus undesirable diffusing --
Line 11, change "will be generated." to -- will not be formed. --
Line 14, change "in this present invention." to -- in the present invention. --
Line 17, change "will become more fully" to -- will be more fully --
Lines 33-34, change "first type Si-substrate." to -- first conductivity type Si-substrate 200 which is provided with a pad oxide layer 210, a silicon nitride layer 220 and a TEOS layer 230 as depicted by Fig. 2A. --
Line 34, change "Then, a trench in the first type Si-substrate" to -- Then, trenches 260 are defined in the first conductivity type Si-substrate 200 --
Line 35, change "buried capacitor therein is difined." to -- buried capacitors therein. --
Line 36, change "oxide layer," to -- oxide layer 270, --
Lines 36-37, change "to comfortably cover the side wall of the trench." to -- to cover conformally the side walls of the trenches 260. --
Lines 37-39, change "A photoresist with a desired thickness is filled on bottom of the trench by photolithography and etching back." to -- A photoresist 280 having a desired thickness fills the bottoms of the trenches 260 by using photolithography and etching back techniques. --
Line 39, change "oxide layer," to -- oxide layer 290, --
Line 40, change "from 100Å~300Å," to -- from 100Å to 300Å, --
Line 41, change "by way of liquid" to -- by liquid --
Lines 41-42, change "to comfortably cover the first oxide layer." to -- to cover conformally the first oxide layer 270. --
Line 44, change "Removing" to -- After removing --
Lines 44-45, change "bottom of the trench, the first oxide layer unshielded by the" to -- bottoms of the trenches, the portions of the first oxide layer 270 which are not shielded by the --
Lines 46-47, change "layer is removed to expose the side wall of the trench." to -- layer 290 are removed to expose lower portions of the side walls of the trenches 260. --
Lines 47-48, change "second type Si-glass is deposited to comfortably cover the second oxide layer" to -- second conductivity type Si-glass 300 is deposited to cover the second oxide layer 290 --
Line 49, change "side wall of the trench." to -- side walls of the trenches conformally. --
Line 49, change "passivation layer," to -- passivation layer 310, --
Line 51, change "second type Si-glass. Afterwards, an annealing is applied" to -- second conductivity type Si-glass 300. Afterwards, an annealing treatment is utilized --

UNITED STATES PATENT AND TRADEMARK OFFICE
CERTIFICATE OF CORRECTION

PATENT NO. : 6,245,612 B1
DATED : June 12, 2001
INVENTOR(S) : Wen-Pin Chang et al.

It is certified that error appears in the above-identified patent and that said Letters Patent is hereby corrected as shown below:

Column 2 (cont'd),
Lines 52-54, change "drive the impurities within the second type Si-glass to diffuse into the first type substrate through the exposed side wall" to -- diffuse the impurities in the second conductivity type Si-glass into the first conductivity type substrate 200 through the formerly exposed side walls --
Line 54, change "layer." to -- layer 310. --
Lines 55-56, change "electrode consisting of the second type diffusion region is generated." to -- electrode 320 consisting of a second conductivity type diffusion region is formed. --
Line 57, change "first type" to -- first conductivity type --
Line 58, change "second type is N-type, and the second type Si-glass" to -- second conductivity type is N-type, and the second conductivity type Si-glass --
Line 59, change "first type" to -- first conductivity type --
Line 60, change "second type is P-type, and the second type" to -- second conductivity type is P-type, and the second conductivity type --
Line 63, change "oxide layer," to -- oxide layer 290, --
Line 64, change "second type Si-glass" to -- second conductivity type Si-glass 300 --
Line 65, change "remained in non-bottom electrode region" to -- remaining in the non-bottom electrode regions --
Line 66, change "first type substrate during anneal." to -- first conductivity type substrate 200 during the annealing treatment. --
Line 67, change "non-desired" to -- undesirable --

Column 3 ,
Line 1, change "will be generated." to -- will not be generated. --
Line 7, change "first type Si-substrate. Then a hard mask with an opening" to -- first conductivity type Si-substrate 200. Then a hard mask 250 with openings 245 therein --
Line 8, change "exposing the substrate is formed on the first-type substrate." to -- exposing portions of the substrate 200 is formed on the first-conductivity type substrate 200. --
Line 9, change "hard mask as an etching mask," to -- hard mask 250 as an etch mask, --
Line 10, change "opening is removed, and a trench" to -- openings is removed, and trenches --
Lines 11-12, change "a buried capacitor therein is produced. A first oxide layer," to -- buried capacitors therein are produced. A first oxide layer 270, --
Line 13, change "to comfortably cover the" to -- to cover conformally the --
Line 14, change "hard mask and the side wall of the trench." to -- hard mask 250 and the side walls of the trenches. --
Line 15, change "filled the trench" to -- fills the trenches --

UNITED STATES PATENT AND TRADEMARK OFFICE
CERTIFICATE OF CORRECTION

PATENT NO.     : 6,245,612 B1
DATED          : June 12, 2001
INVENTOR(S)    : Wen-Pin Chang et al.

It is certified that error appears in the above-identified patent and that said Letters Patent is hereby corrected as shown below:

Column 3 (cont'd),
Line 16, change "photoresist with a" to -- photoresist 280 having a --
Line 17, change "bottom of the trench" to -- bottoms of the trenches --
Line 19, change "oxide layer," to -- oxide layer 290, --
Line 20, change "from 100Å~300Å," to -- from 100Å to 300Å, --
Line 21, change "by way of liquid" to -- by liquid --
Line 22, change "hard mask and the first oxide layer." to -- hard mask 250 and the first oxide layer 270. --
Line 24, change "Removing" to -- After removing --
Line 25, change "bottom of the trench, the first oxide layer" to -- bottoms of the trenches, the portions of the first oxide layer left --
Line 26, change "layer is removed" to -- layer are removed --
Line 27, change "wall of the trench. A second type" to -- walls of the trenches. A second conductivity type --
Line 28, change "Si-glass is deposited to conformally cover the second oxide" to -- Si-glass 300 is then deposited to conformally cover the second oxide --
Line 29, change "layer and the exposed side wall of the trench." to -- layer 290 and the exposed side walls of the trenches. --
Line 30, change "passivation layer" to -- passivation layer 310 --
Line 31, change "second-type Si-glass." to -- second-conductivity type Si-glass 300. --
Line 32, change "an annealing is applied at 1050°C for 20 minutes to" to -- an annealing treatment is applied at 900 to 1200°C (preferably 1050°C) for 10 to 50 minutes (preferably 20 minutes) to --
Line 35, change "region" to -- region 320 --
Line 36, change "the second type" to -- the second conductivity type --
Line 38, change "the passivation layer, the Si-glass layer," to -- the passivation layer 310, the Si-glass layer 300, --
Line 39, change "layer and the first oxide layer" to -- layer 290 and the first oxide layer 270 --
Line 41, change "first type" to -- first conductivity type --
Line 42, change "second type" to -- second conductivity type --
Lines 42-43, change "the second type impurities" to -- second conductivity type impurities --
Line 44, change "first type" to -- first conductivity type --
Line 45, change "the second type" to -- second conductivity type --
Line 48, change heading "EMBODIMENT OF THE INVENTION" to -- AN EMBODIMENT OF THE INVENTION --
Line 62, change "A trench with" to -- A trench 260 with --
Line 63, change "by etching the substrate 200" to -- by etching those portions of the substrate 200 left --

UNITED STATES PATENT AND TRADEMARK OFFICE
CERTIFICATE OF CORRECTION

PATENT NO.   : 6,245,612 B1
DATED        : June 12, 2001
INVENTOR(S)  : Wen-Pin Chang et al.

It is certified that error appears in the above-identified patent and that said Letters Patent is hereby corrected as shown below:

Column 4,
Lines 2-3, change "and filled the trench 260 by photolithography." to -- which filled the trench 260. --
Line 4, change "and partial of the photoresist layer 280 were" to -- and portions of the photoresist layer 280 in the trenches 260 were --
Line 5, change "and a photoresist 280 with a" to -- so that a layer of photoresist 280 having a --
Line 6, change "4-6µM was remained on the bottom of" to -- 4-6µM remained on the bottoms of --
Line 7, change "the trench" to -- each of the trenches --
Line 8, change "capacitor" to -- capacitors --
Line 12, change "LPO layer" to -- LPO layer 290 --
Line 12, change "oxide layer," to -- oxide layer 270, --
Line 14, change "nitride 220 and the photoresist" to -- nitride 220 or on the photoresist --
Line 16, change "within the" to -- in the --
Line 17, change "bottom of the trench" to -- bottoms of the trenches --
Line 19, change "for bottom electrodes and" to -- for the bottom electrodes --
Line 21, change "substrate 200." to -- substrate 200 thereat. --
Line 24, change "wall of the trench" to -- walls of the trenches --
Line 25, change "region" to -- regions --
Line 26, change "electrode" to -- electrodes --
Line 28, change "an annealing" to -- an annealing treatment --
Line 29, change "within the AsSG 300" to -- in the AsSG layer 300 --
Line 30, change "to diffuse into" to -- into --
Line 31, change "side wall of the trench" to -- side wall of the trenches --
Line 32, change "consists of As" to -- formed by the As --
Line 36, change "solution" to -- solutions --
Line 53, change "first type" to -- first conductivity type --
Line 56, change "filling a photoresist into the trench by" to -- partially filling the trench with a photoresist by --
Line 61, change "on the bottom of" to -- in --
Line 64, change "expose the side" to -- expose a portion of the side --
Line 65, change "a second type" to -- a second conductivity type --

Column 5,
Line 3, change "second type" to -- second conductivity type --
Line 4, change "to diffuse into the Si-substrate and form" to -- into the Si-substrate and thereby form --
Line 5, change "a second type" to -- a second conductivity type --

UNITED STATES PATENT AND TRADEMARK OFFICE
CERTIFICATE OF CORRECTION

PATENT NO. : 6,245,612 B1
DATED : June 12, 2001
INVENTOR(S) : Wen-Pin Chang et al.

It is certified that error appears in the above-identified patent and that said Letters Patent is hereby corrected as shown below:

Column 5 (cont'd),
Line 10, change "layer consists of silicon oxide with a" to -- layer comprises silicon oxide having a --
Line 20, change "consists of TEOS with a" to -- comprises TEOS having a --
Lines 22-23, change "first type is P-type, and the second type" to -- first conductivity type is P-type, and the second conductivity type --
Lines 24-25, change "the second type Si-glass layer consists of AsSG" to -- the second conductivity Si-glass layer comprises AsSG --
Lines 26-27, change "first type is N-type, and the second type" to -- first conductivity type is N-type, and the second conductivity type --
Lines 28-29, change "the second type Si-glass layer consists of BSG." to -- the second conductivity Si-glass layer comprises BSG. --
Lines 31-32, change "annealing is applied at a temperature ranging from 900~1200°C under $N_2$ for 10~50 minutes." to -- annealing step performed at a temperature ranging from 900 to 1200°C under $N_2$ for 10 to 50 minutes. --
Line 39, change "first type" to -- first conductivity type --
Line 43, change "opening by" to -- opening --
Line 44, change "an etching mask, and forming" to -- an etch mask, thereby forming --
Line 45, change "first type" to -- first conductivity type --
Lines 48-49, change "forming a first photoresist on the first oxide layer and filling the trench by means of photolithography;" to -- forming a photoresist on the first oxide layer and filling the trench; --
Lines 50-52, change "removing the first photoresist on the hard mask and the top portion within the trench to form a second photoresist on the bottom of the trench;" to -- removing the photoresist on the hard mask and from an upper portion within the trench to define a region of photoresist on a bottom portion of the trench; --

Column 6,
Line 4, change "the second photoresist" to -- the photoresist --
Line 13, change "second type" to -- second conductivity type --
Line 15, change "second type" to -- second conductivity type --
Line 16, change "layer to diffuse into the first type" to -- layer into the first conductivity type --
Line 18, change "and form a second type diffusion" to -- to thereby define a second conductivity type diffusion --
Line 21, change "first layer in series." to -- first oxide layer. --

UNITED STATES PATENT AND TRADEMARK OFFICE
CERTIFICATE OF CORRECTION

PATENT NO. : 6,245,612 B1
DATED : June 12, 2001
INVENTOR(S) : Wen-Pin Chang et al.

It is certified that error appears in the above-identified patent and that said Letters Patent is hereby corrected as shown below:

<u>Column 6 (cont'd),</u>
Line 23, change "layer consists of silicon oxide with a thickness" to -- layer comprises silicon oxide having a thickness --
Line 35, change "layer consists of TEOS, and has a" to -- layer comprises TEOS, having a --
Lines 37-38, change "first type is P-type, and the second type" to -- first conductivity type is P-type, and the second conductivity type --
Line 40, change "second type Si-glass layer consists of AsSG" to -- the second conductivity Si-glass layer comprises AsSG --
Lines 41-42, change "first type is N-type, and the second type" to -- first conductivity type is N-type, and the second conductivity type --
Line 44, change "second type Si-glass layer consists of BSG." to -- second conductivity Si-glass layer comprises BSG. --
Lines 46-47, change "annealing is applied at a temperature ranging from 900~1200°C" to -- annealing step is performed at a temperature ranging from 900 to 1200°C --

Signed and Sealed this

Ninth Day of March, 2004

JON W. DUDAS
*Acting Director of the United States Patent and Trademark Office*